United States Patent [19]

Li et al.

[11] Patent Number: 5,358,755
[45] Date of Patent: Oct. 25, 1994

[54] AMORPHOUS HYDROGENATED SILICON-CARBON ALLOYS AND SOLAR CELLS AND OTHER SEMICONDUCTOR DEVICES PRODUCED THEREFROM

[75] Inventors: Yuan-Min Li, Langhorne; Benjamin F. Fieselmann, Newtown, both of Pa.

[73] Assignee: Amoco Corporation, Chicago, Ill.

[21] Appl. No.: 106,369

[22] Filed: Aug. 13, 1993

[51] Int. Cl.$^5$ .................. B05D 3/06; C23C 16/00
[52] U.S. Cl. .................. 427/577; 427/578; 427/583; 427/255.2
[58] Field of Search .............. 427/563, 574, 577, 578, 427/583, 589, 255.1, 255.2

[56] References Cited

U.S. PATENT DOCUMENTS

| | | | |
|---|---|---|---|
| 4,532,150 | 7/1985 | Endo et al. | 427/578 |
| 4,683,145 | 7/1987 | Nishimura et al. | 427/583 |
| 4,690,830 | 9/1987 | Dickson et al. | 427/583 |
| 4,801,468 | 1/1989 | Ishihara et al. | 427/578 |
| 4,910,153 | 3/1990 | Dickson | 427/569 |
| 4,923,716 | 5/1990 | Brown et al. | 427/255.2 |
| 5,011,706 | 4/1991 | Tarhay et al. | 437/100 |
| 5,061,322 | 10/1991 | Asano | 427/577 |

FOREIGN PATENT DOCUMENTS 1091360  5/1986  Japan ................. 427/577

OTHER PUBLICATIONS

Fölsch et al., "Differences in the structure of α-Hydrogenated Si-C Layers prepared with either methane or silylmethanes", *J. Appl. Phys.*, vol. 73, No. 12 15 Jun. 1993, pp. 8485–8487.

Y. M. Li and B. F. Fieselmann, "Improvement of the optical and photoelectric properties of hydrogenated amorphous silicon-carbon alloys by using trisilylmethane as a feedstock", *Appl. Phys. Lett.* 59(14), Sep. 30, 1991.

Y. M. Li, B. F. Fieselmann and A. Catalano, "Novel Feedstocks for a-SiC:H Films and Devices", *Twenty Second IEE Photovoltaic Specialists Conference-1991 vol. II*, Riviera Hot. Las Vegas, N.V. Oct. 7–Nov. 1991, pp. 1231–1235.

Y. M. Li, B. F. Fieselmann and A. Catalano, "Novel Feestocks for a-SiC:H Films", *Springer Proceedings in Physics, vol. 71, Amorphous and Crystalline Silicone Carbide IV*, published by Springer-Verlag Berlin Heidelberg 1992, edited by C. Y. Yang, M. M. Rahman, and G. L. Harris, pp. 229–238.

Yuan Min Li, A. Catalano, and B. F. Fieselmann, "Film and Solar Cell Properties of a-SiC:H Alloys", *Mat. Res. Soc. Symp. Proc. [of Materials Research Society]*, vol. 258, believed to be published Oct. 1992, pp. 923–928.

"Solar Cells", *McGraw-Hill Encyclopedia of Science & Technology*, vol. 16, 1987, pp. 565–568 no month.

*Primary Examiner*—Marianne Padgett
*Attorney, Agent, or Firm*—Thomas W. Tolpin

[57] ABSTRACT

Amorphous hydrogenated silicon-carbon alloys having particular usefulness in the preparation of photovoltaic devices, such as solar cells, with improved properties, such as high open circuit voltage with high fill factor and improved blue response, and stability, are provided by the process of depositing the alloy on a substrate maintained at a relatively low temperature below about 260° C. in a vapor deposition chamber, and introducing a gaseous mixture comprising at least one compound having the formula $(SiX_3)_3CX^1$ wherein each X and $X^1$ is selected from the group consisting of hydrogen and halogen, and a high proportion of hydrogen, in a ratio by volume of from about 50 parts to about 2000 parts hydrogen to 1 part of $(SiX_3)_3CX^1$ compound, under deposition conditions of low excitation power density of less than about 50 mw/cm$^2$, and high pressure of more than about 0.1 torr.

14 Claims, 1 Drawing Sheet

AMORPHOUS HYDROGENATED SILICON-CARBON ALLOYS AND SOLAR CELLS AND OTHER SEMICONDUCTOR DEVICES PRODUCED THEREFROM

BACKGROUND OF THE INVENTION

1. Field of the Invention

The present invention relates to hydrogenated amorphous silicon alloys, and, more particularly, to a process for producing improved hydrogenated amorphous silicon-carbon alloys having carbon-silicon bonds, which are useful in the production of semiconductor devices and particularly photovoltaic devices.

2. Description of Related Art

U.S. Pat. No. 4,690,830 teaches hydrogenated amorphous silicon alloys which are improved as compared to previously known hydrogenated amorphous silicon-carbon alloys, particularly those prepared by incorporating such gases as methane, germane, germanium tetrafluoride, diborane and phosphine in the deposition gas mixture. While the improvements provided by U.S. Pat. No. 4,690,830 have been beneficial in the production of useful alloys for semiconductor devices, such as photovoltaic cells, it is desirable to provide further improvements in undoped hydrogenated amorphous silicon-carbon alloys in order to attain such semiconductor devices as solar cells with even greater improved properties, such as higher open circuit voltages at desirable, active layer (i.e. the i-layer) bandgaps of 1.8 eV or more, high fill factors, and improved solar cell stability.

SUMMARY OF THE INVENTION

Hence, it is one object of the present invention to provide improved amorphous silicon-carbon alloys from which semiconductor devices, such as photovoltaic cells, can be produced having additionally improved properties.

It is another object of this invention to provide a method by which amorphous silicon-carbon alloys can be produced which are useful to produce semiconductor devices, and particularly photovoltaic cells, which have improved highly desirable properties.

Another object of the present invention is to provide a method for preparing amorphous silicon-carbon alloys of improved photoconductivity as compared to alloys prepared from carbon feedstocks such as methane, silylmethane and the like.

Still another object of this invention is to provide amorphous silicon-carbon alloys of higher photoconductivity and improved uniformity from which improved photovoltaic devices can be obtained.

Another object of the present invention is to provide a method for preparing amorphous silicon-alloys from which photovoltaic devices, particularly solar cells, can be produced, having improved stability as compared to cells previously prepared from silicon-carbon alloys.

These and other objects and advantages of the present invention will be apparent from the following description.

In accordance with the present invention, improved amorphous hydrogenated silicon-carbon alloys are prepared by a process comprising preparing a vapor deposition chamber; placing a substrate in the chamber and maintaining the substrate at a relatively low temperature below about 260° C.; and introducing into the deposition chamber a gaseous mixture comprising (1) at least one compound having the formula:

wherein each X and $X^1$ is selected from the group consisting of hydrogen and halogen, and (2) hydrogen, in a ratio by volume of above about 50 parts, and preferably to about 2000 parts hydrogen to 1 part of $(SiX_3)_3CX^1$ compound; under deposition conditions of low excitation power density of less than about 50 mw/cm², and a pressure of more than about 0.1 torr. The high ratio of hydrogen, high pressure, low substrate temperature, low excitation power in the process of the present invention has been found to provide amorphous silicon-carbon alloys, and photovoltaic devices, such as solar cells, having the improved properties, particularly stability, as hereinafter described.

In a preferred process of the present invention, the gaseous mixture also includes silane in a ratio by volume of from about 10 parts to about 200 parts or more silane to one part of $(SiX_3)_3CX^1$ compound. The vapor deposition process of the present invention is preferably performed by chemical vapor deposition, and most preferably wherein the chemical vapor deposition is enhanced by being performed by glow discharge or by laser excitation. In the former instance, the glow discharge can be sustained, either by dc glow discharge or ac glow discharge, preferably performed at, for example, a frequency of between approximately 10 and approximately 200 megahertz.

The process of the present invention deposits on the substrate one or more regions of amorphous hydrogenated silicon-carbon alloy having silicon-carbon bonds. Photovoltaic devices of improved properties as heretofore described can be readily prepared from the substrate having one or more regions of alloy as described by applying front and back contacts to the substrate in a manner known to those skilled in the art.

The improvement in the alloys of the present invention is unexpected as no improvement was found in the properties of solar cells prepared from alloys using a process in which the process parameters described above were individually varied into the range of parameters in combination required in the present invention. The alloys were prepared by depositing amorphous hydrogenated silicon-carbon alloys using an initial gaseous mixture of trisilylmethane and silane, in a ratio by volume of about 40 parts of silane to 1 part of trisilylmethane, in a vapor deposition chamber on a substrate initially maintained at a temperature at about 260° C. and an initial pressure below about 0.4 torr. Improvement in properties of solar cells from the alloys prepared were sought by adding hydrogen gas to the gaseous mixture and varying separately the substrate temperature to a lower temperature of about 80° C. and raising the pressure to 0.5 torr. Hydrogen gas was added to the gaseous mixture starting at zero parts and increasing the ratio by volume of hydrogen to about 1000 parts hydrogen to 1 part of trisilylmethane. Also the power applied to the vapor deposition to sustain glow discharge was reduced to about 10 mW/cm² from about 50 mW/cm². In each instance, the stability of solar cells prepared from the deposited amorphous silicon-carbon alloy was poorer than the alloys deposited under the indicated in initial conditions. However, upon depositing alloys in accordance with the process of the present invention improvement in the properties of the solar cells produced from the alloys were unexpectedly obtained, as will be hereinafter shown.

The alloys prepared according to the process of the present invention can, for example, provide an improved i-layer in a p-i-n photovoltaic device having more uniform microstructure and stability than in previous amorphous hydrogenated silicon-carbon alloys. The improvement in the i-layer is achieved without the effect of dopants, such as diborane, as such dopants, if present, may have a beneficial effect on the p-layer, but are undesirable for the i-layer. Therefore, dopants are not used with the present invention and are to be avoided. Photovoltaic devices prepared from the alloys of the present invention are believed to have improved desirable properties, in large part, due to the improved i-layer of the alloys resulting from the process described in this application.

The present invention will be readily understood by those skilled in the art from the brief description of the drawing and the preferred embodiments which follow.

DESCRIPTION OF THE PREFERRED EMBODIMENT

Figure 1:
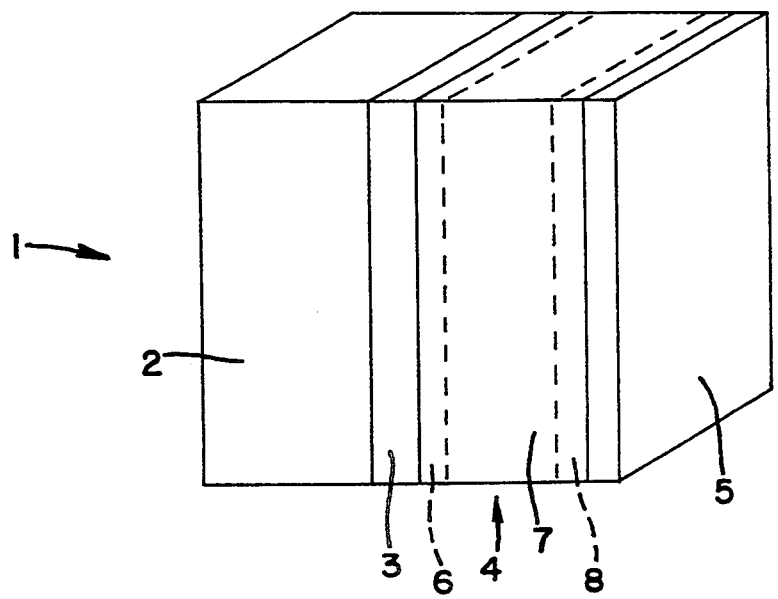
FIG. 1 is an illustration of a photovoltaic device embodying the alloy of the present invention made according to the process set forth herein, wherein, for clarity, the representation of the layers and junctions are not drawn to scale.

In the preferred embodiment of the method of the present invention, vapor deposition of amorphous hydrogenated silicon-carbon alloy is achieved in a conventional rf glow discharge deposition chamber. A suitable substrate, for example, conductive transparent oxides of metal, such as tin oxide, on a transparent base, e.g. glass, or non-transparent metals, such as stainless steel, is placed in the chamber. In the preferred embodiment, the substrate is maintained at a temperature below about 250° C., and preferably above about 85° C., and the deposition chamber is activated at an excitation power density of less than about 50 mW/cm$^2$. A gaseous mixture comprising at least one compound having the formula $(SiX_3)_3CX^1$, wherein each X and $X^1$ is selected from the group consisting of hydrogen and halogen, and hydrogen, in a ratio by volume of from about 50 parts to about 2000 parts hydrogen to 1 part of $(SiX_3)_3CX^1$ compound, is introduced into the deposition chamber at a pressure of more than about 0.1 torr, for example between about 1 and about 10 torr. Preferably, silane is included in the gaseous mixture introduced into the chamber, in a ratio by volume of from about 10 parts to about 200 parts silane to one part of $(SiX_3)_3CX^1$ compound.

In the process of the present invention, it is preferred to utilize as the carbon-silicon bond feedstock $(SiX_3)_3CX^1$ compounds wherein $X^1$ is hydrogen, for example, trisilylmethane and halogenated trisilylmethanes, such as chlorinated trisilylmethanes and fluorinated trisilylmethanes. A useful example of the latter is tris(trifluorosilyl)methane having the formula $(SiF_3)_3CH$. Most preferably, the carbon-silicon bond feedstock utilizes the $(SiX_3)_3CX^1$ compound wherein all of X and $X^1$ are hydrogen i.e. trisilylmethane. Also preferably, the amount of hydrogen gas to $(SiX_3)_3CX^1$ compound is present in the gaseous mixture in a ratio by volume of from about 50 parts to about 2000 parts hydrogen to one part $(SiX_3)_3CX^1$ compound, and the gaseous mixture includes silane, preferably in a ratio by volume of from about 10 parts to about 200 parts silane to one part $(SiX_3)_3CX^1$ compound.

The following examples illustrate the process of the present invention, the alloys prepared therefrom, and solar cells and their properties, which can be prepared from the alloys.

EXAMPLES

Into an rf glow-discharge chemical vapor deposition chamber using diode reactors, each reactor having a substrate of conductive tin oxide on glass, the substrates being maintained at temperatures between 200° C. and 260° C., was introduced a gaseous mixture of trisilylmethane, hydrogen and silane in ratios of about 400 parts hydrogen to one part trisilylmethane and from about 44 parts silane to one part trisilylmethane, at a pressure of about 0.4 torr. The deposition of the amorphous hydrogenated silicon-carbon alloy was continued until alloy films having thicknesses of between about 700 and about 12,000 Å were attained. The bandgap of the alloy films produced was between 1.83 eV and 1.96 eV.

p-i-n solar cells were prepared from alloys deposited on the substrate, prepared as noted above, by deposition of the alloy film, and by subsequent back contact metallization, i.e. by deposition, of zinc oxide and silver on the surface of the alloy film opposite the substrate, in the manner known to those in the art. Solar cells as thus prepared are illustrated in FIG. 1, which is not drawn to scale. Light (arrow 1) enters through the glass support substrate 2 as noted above, and through the conductive tin oxide contact layer 3. Next, the light passes into the amorphous silicon region 4. The back contact layer noted above is represented by numeral 5. The amorphous silicon region 4 is a p-i-n junction, i.e., the layer 4 includes a positively doped layer 6, an intrinsic (i—) layer 7, and a negatively doped layer 8.

Solar cells as prepared above from the alloys of the preferred embodiment have superior properties as compared to solar cells prepared under comparable process conditions from methane (as the carbon source) and silane, and from methane, hydrogen and silane, as the feedstock gaseous mixture, in ratios of 10 and 50 parts hydrogen to one part methane and silane. Thus, solar cells prepared from alloys using trisilylmethane and halogenated trisilylmethanes as the carbon source in accordance with the present invention are preferred and provide improved properties as compared to cells prepared from methane and hydrogen alloys. For example, p-i-n cells having a buffer layer between the p and i layers and with the/-layer having a combined thickness of from about 700 Å to about 1000 Å prepared from alloys deposited using trisilylmethane in accordance with the preferred embodiment were found to have a short wavelength quantum efficiency or blue response measured at about 400 nm of from 0.73–0.75, open circuit voltage of from about 0.93 volts to about 0.99 volts, short circuit current of from about 7.3 mA/cm$^2$ to about 7.9 mA/cm$^2$, fill factor of from about 0.62 to about 0.75, and efficiency of from about 4.7% to about 5.5%. At least one cell prepared in this manner had considerably poorer properties and is believed to be an anomaly.

As noted above, through the process of the present invention, in accordance with this embodiment, high quality alloy films of amorphous hydrogenated silicon-carbon alloys were obtained and high quality, improved solar cells were prepared using the alloys. The solar cells described are single junction p-i-n solar cells having the amorphous hydrogenated silicon-carbon alloys as the i-layers and/or the buffer layers between the p and i layers, using trisilylmethane as the carbon source in the feedstock for the alloy. The combined thickness of the buffer and the i-layer is comparable to what would be needed for the top absorber in triple junction solar cells.

The high open circuit voltage together with the high fill factor, improved blue response and stability, attained in accordance with the present invention, is not attainable using alloys prepared from such hydrocarbons as methane as the carbon source under comparable conditions. It is unexpected that through the process of the present invention, the improvement in the i-layer quality alone, provides alloys from which solar cells can be obtained having open circuit voltages approaching one volt with only mild loss in fill factor, and improved stability.

While a particular embodiment of the amorphous hydrogenated silicon-carbon alloys and solar cells and other semiconductor devices produced therefrom of the invention has been shown and described, it will be appreciated by those skilled in the art that changes and modifications may be made thereto without departing from the invention in its broader aspects and as set forth in the following claims.

We claim:

1. A process for preparing an amorphous hydrogenated silicon-carbon alloy, comprising:
   a) preparing a vapor deposition chamber;
   b) placing a substrate in the chamber and maintaining the substrate at a temperature below about 260° C.; and
   c) subjecting the substrate to a vapor deposition step by introducing into the deposition chamber a gaseous mixture comprising
      (1) at least one compound having the formula:

$(SiX_3)_3CX^1$ wherein each X and $X^1$ is selected from the group consisting of hydrogen and halogen, and
      (2) hydrogen, in a ratio by volume of from about 50 parts to about 2000 parts hydrogen to 1 part $(SiX_3)_3CX^1$ compound;
   d) under deposition conditions of excitation power density of less than about 50 mW/cm² at a surface of the substrate, and a pressure of more than about 0.1 torr whereby one or more hydrogenated amorphous silicon-carbon alloy regions are deposited onto the substrate.

2. The process of claim 1, wherein the gaseous mixture introduced into the deposition chamber further comprises silane in a ratio by volume of from about 10 parts to about 200 parts silane to 1 part $(SiX_3)_3CX^1$ compound.

3. The process of claim 1, wherein $X^1$ is hydrogen.

4. The process of claim 3, wherein the gaseous mixture introduced into the deposition chamber further comprises silane in a ratio by volume of from about 10 parts to about 200 parts silane to 1 part $(SiX_3)_3CX^1$ compound.

5. The process of claim 1 wherein the vapor deposition step is performed by chemical vapor deposition.

6. The process of claim 5, wherein the vapor deposition step is performed by glow discharge.

7. The process of claim 6 wherein the glow discharge is a.c. glow discharge performed at a frequency of between approximately 10 and approximately 200 megahertz.

8. The process of claim 4, wherein the vapor deposition step is performed by chemical vapor deposition.

9. A process for preparing a semiconductor device comprising:
   a) preparing a vapor deposition chamber;
   b) placing a substrate in the chamber and maintaining the substrate at a temperature above ambient temperature and below about 260° C., and;
   c) introducing into the deposition chamber a gaseous mixture comprising
      (1) at least one compound having the formula:

$(SiX_3)_3CX^1$ wherein each X and $X^1$ is selected from the group consisting of hydrogen and halogen, and
      (2) hydrogen, in a ratio by volume of from about 50 parts to about 2000 parts hydrogen to 1 part $(SiX_3)_3CX^1$ compound,
   d) under deposition conditions of excitation power density of less than about 50 mW/cm² at a surface of the substrate, and a pressure of more than about 0.1 torr whereby one or more hydrogenated amorphous silicon-carbon alloy regions are deposited onto the substrate.

10. The process of claim 9 wherein the gaseous mixture introduced into the deposition chamber further comprises silane in a ratio by volume of from about 10 parts to about 200 parts silane to 1 part $(SiX_3)_3CX^1$ compound.

11. The process of claim 9, wherein $X^1$ is hydrogen.

12. A process for preparing a photovoltaic device comprising:
   a) preparing a vapor deposition chamber;
   b) placing a substrate in the chamber and maintaining the substrate at a temperature above ambient temperature and below about 260° C., and;
   c) introducing into the deposition chamber a gaseous mixture comprising
      (1) at least one compound having the formula:

$(SiX_3)_3CX^1$ wherein each X and $X^1$ is selected from the group consisting of hydrogen and halogen, and
      (2) hydrogen, in a ratio by volume of from about 50 parts to about 2000 parts hydrogen to 1 part $(SiX_3)_3CX^1$ compound,
   d) under deposition conditions of excitation power density of less than about 50 mW/cm² at a surface of the substrate, and a pressure of more than about 0.1 torr whereby one or more hydrogenated amorphous silicon-carbon alloy regions are deposited onto the substrate; and front and back contacts are applied to the substrate thereby forming the photovoltaic device.

13. The process of claim 12, wherein the gaseous mixture introduced into the deposition chamber further comprises silane in a ratio by volume of from about 10 parts to about 200 parts silane to 1 part $(SiX_3)_3CX^1$ compound.

14. The process of claim 12, wherein $X^1$ is hydrogen.

* * * * *